United States Patent [19]

Maruta

[11] Patent Number: 4,684,925

[45] Date of Patent: Aug. 4, 1987

[54] METHOD AND APPARATUS FOR CONVERTING AN ANALOG SIGNAL TO A DIGITAL SIGNAL USING AN OVERSAMPLING TECHNIQUE

[75] Inventor: Rikio Maruta, Tokyo, Japan

[73] Assignee: NEC Corporation, Tokyo, Japan

[21] Appl. No.: 751,909

[22] Filed: Jul. 5, 1985

[30] Foreign Application Priority Data

Jul. 5, 1984 [JP] Japan ............................. 59-139635
Jul. 18, 1984 [JP] Japan ............................. 59-148920

[51] Int. Cl.$^4$ ............................................. H03M 3/00
[52] U.S. Cl. ...................... 340/347 AD; 340/347 DD
[58] Field of Search ................ 340/347 AD, 347 DD; 364/724; 375/27, 28

[56] References Cited

U.S. PATENT DOCUMENTS

| | | | |
|---|---|---|---|
| 3,937,897 | 2/1976 | Song | 340/347 DD |
| 3,962,636 | 6/1976 | Sparrendahl | 375/28 |
| 4,002,981 | 1/1977 | Eggermont | 340/347 DD |
| 4,016,410 | 4/1977 | Eggermont | 375/28 UX |
| 4,281,318 | 7/1981 | Candy | 340/347 DD |
| 4,301,446 | 11/1981 | Petit | 340/347 AD |
| 4,528,551 | 7/1985 | Agrawal | 375/27 |

OTHER PUBLICATIONS

McLane et al., "Proceeding of IEEE International Conf. on Acoustics, Speech and Signal Processing", Apr. 9-11, 1980, pp. 364-367.

Tewksbury et al.; Oversampled, Linear Predictive and Noise-Shaping Coders of Order N>1; IEEE Trans. Circuits and Systems, vol. CAS-25, No. 7, Jul. 1978, pp. 436-447.

*Primary Examiner*—Charles D. Miller
*Attorney, Agent, or Firm*—Sughrue, Mion, Zinn, Macpeak and Seas

[57] ABSTRACT

An A-D converter which oversamples the input analog signal, at a frequency greater than the Nyquist frequency, and achieves high precision linear coding by performing simple operations at a high sampling frequency $f_H$ while complicated operations are performed at a low sampling frequency $f_s$. The high sampling frequency may be reduced to the low sampling frequency through a two-step reduction using a sampling frequency converter to reduce the frequency to an intermediate frequency $f_M$ and an integrator/sampler to reduce the sampling frequency further to $f_s$ or directly with the use of an FIR filter having a frequency characteristic in which attenuation is large in the out-of-band and gain deviation is small in-band.

5 Claims, 34 Drawing Figures

METHOD AND APPARATUS FOR CONVERTING AN ANALOG SIGNAL TO A DIGITAL SIGNAL USING AN OVERSAMPLING TECHNIQUE

BACKGROUND OF THE INVENTION

This invention relates to an oversampled analog-to-digital (A/D) converting method and apparatus capable of achieving precise coding.

Oversampled coders sample an analog signal at a higher frequency than the Nyquist frequency, quantize the sampled signal, and perform the band limitation and reduction of the sampling frequency to produce a coded output. For details of the oversampled coder, reference is made to an article by Stuart K. Tewksbury et al., entitled "Oversampled, Linear Predictive and Noise-Shaping Coders of Order N >1", published in the IEEE Transactions On Circuits And Systems, Vol. CAS-25, No. 7, July issue, 1978, pp. 436–447. Since the above-mentioned oversampled coder may be composed of only digital circuits with exception of a low resolution digital-to-analog (D/A) converter and an integrator, the coder is suitable for a large scale integration circuit (LSI).

With a view to minimizing the whole device as well as to lowering power consumption and the manufacturing cost of the device, it is necessary not only to simplify the analog structural elements used but also to reduce the number of operations per unit time in the digital structural elements used. For this purpose, it is desirable that simple operations are performed at a high sampling frequency, while complicated ones, at a low sampling frequency.

SUMMARY OF THE INVENTION

It is, therefore, an object of the invention to provide a method and apparatus for A/D conversion using an oversampling technique to achieve high precision linear coding.

It is another object of the invention to provide a method and apparatus for A/D conversion enabling a digital circuit operable at a high frequency to be simplified.

It is still another object of the invention to provide a method and apparatus for A/D conversion suitable for LSI's.

According to one aspect of the invention, there is provided an oversampled A/D converting method comprising the steps of: oversampling an input analog signal at a first frequency higher than the Nyquist frequency to produce a sampled signal; subtracting a local decoded signal from the sampled signal; quantizing the subtracted signal into a quantized binary signal; generating said local decoded signal by integrating the quantized binary signal; converting the quantized binary signal having the first frequency into a frequency-reduced signal having a second frequency; and integrating the frequency-reduced signal at the second frequency to produce a converted digital signal.

According to the invention, there is also provided an oversampled A/D converter comprising: means for sampling an input analog signal at a first frequency higher than the Nyquist frequency to produce a sampled signal; a subtracter for subtracting a local decoded signal from the sampled signal; a quantizer for quantizing the output of the subtracter to produce a quantized binary signal; means for integrating the quantized binary signal to generate the local decoded signal; a converting means for converting the quantized binary signal having the first frequency into a frequency-reduced signal having a second frequency; and an integrator for integrating the frequency-reduced signal at the second frequency to produce a converted digital signal.

BRIEF DESCRIPTION OF THE DRAWING

The invention will be described more in detail with reference to the accompanying drawings.

Like reference numerals denote like structural elements.

DESCRIPTION OF THE PRIOR ART

For easier understanding of the invention, a prior art oversampled A/D converter (referred to as a oversampled coder) will be described with reference to FIG. 1 and FIGS. 2A to 2F.

Figure 2A:
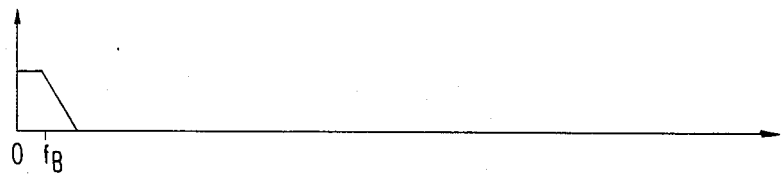
FIGS. 2A through 2F are waveform diagrams for describing the operation of the converter shown in FIG. 1.
Figure 2B:
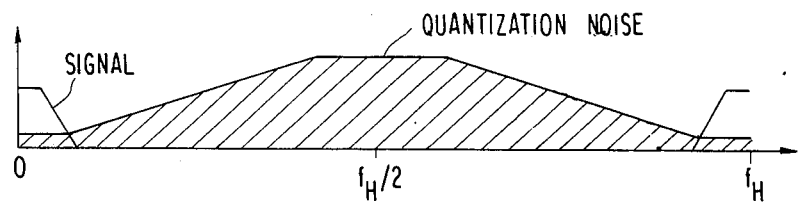
Figure 2C:
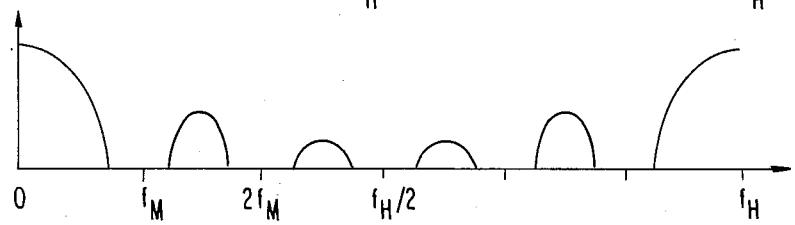

Referring to those drawings, an input analog signal applied to an input terminal 1 is assumed to have a frequency band of about $f_b$(Hz) as shown in FIG. 2A. The input signal is converted into a sampled signal by a sampling switch 11 which operates at a higher sampling frequency $f_H$ than the Niquist sampling frequency, $2f_B$. A subtracter 12 subtracts a local decoded analog signal from the sampled signal to produce an error signal. The error signal is integrated by a noise-shaping integrator 13 to produce an integrated signal. Another subtracter 14 subtracts the local decoded signal from the integrated signal to supply the difference to a two level quantizer 15. The quantizer 15 discriminates a sign of the output of the subtracter 14 and produces $+\Delta$ or $-\Delta$ based on the discriminated positive or negative sign. A predictive integrator 16 integrates the quantized output to produce a local decoded digital signal (FIG. 2B), which is converted into a local decoded analog signal by a D/A converter 17. Assuming that a sampling interval $T=1/f_H$ and $Z=\exp(sT)$, the integrators 13 and 16 have, in Z plane, system functions represented by $1/(1-z^{-1})$ and $z^{-1}/(1-z^{-1})$, respectively. The integrator 13 or 16 can be realized with an adder 131 or 161 and a delay circuit 132 or 162 having one sample delay.

Figure 1:
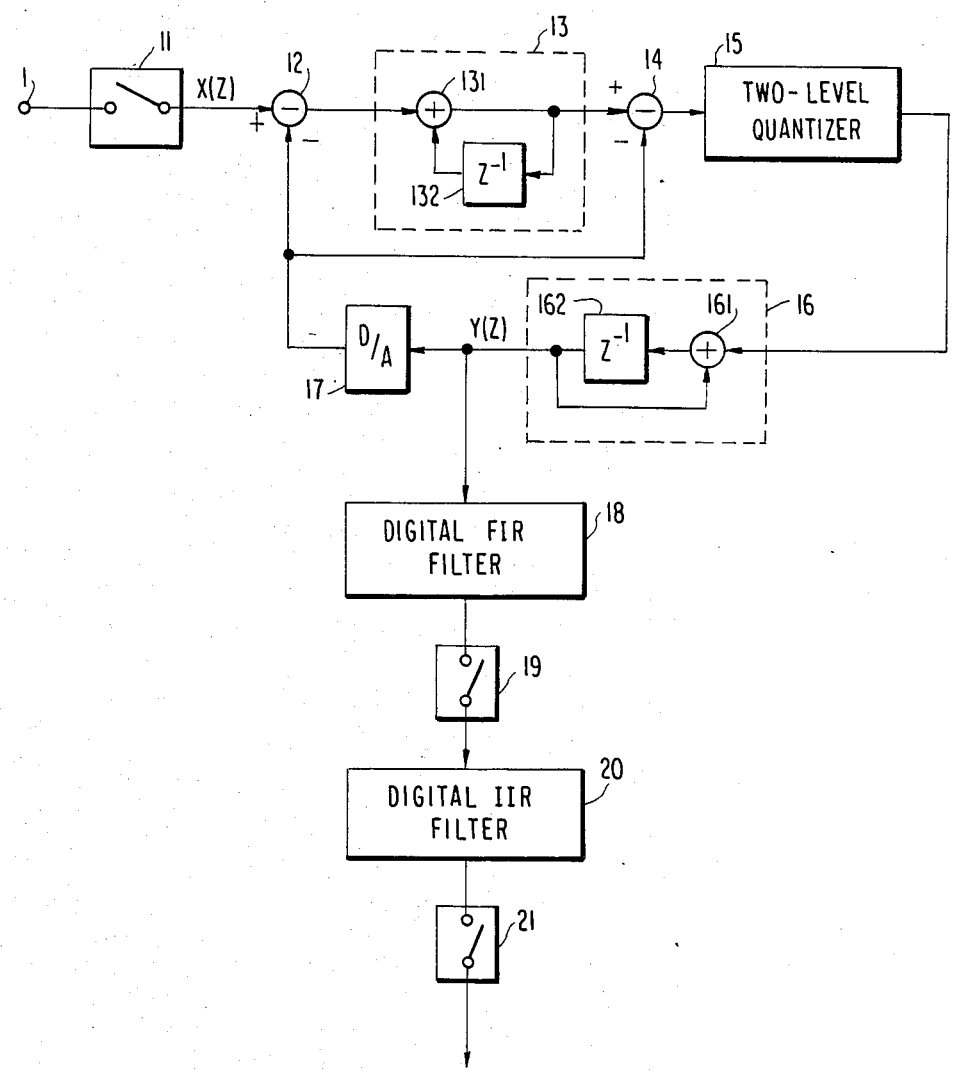
FIG. 1 is a block diagram showing a prior art oversampled A/D converter.

The coded signal having the sampling frequency $f_H$ given from the integrator 16 is then converted into a signal having the Nyquist sampling frequency $f_s=(2 \times f_B)$ In the oversampled coder shown in FIG. 1, the sampling frequency $f_H$ is reduced to the sampling frequency $f_s$ through the intermediate sampling frequency $f_M$. It is noted that $f_M$ is defined as $f_H > f_M > f_s$, and that $f_H/f_M = M$ and $f_M/f_s = N$ are chosen to be integer numbers.

Figure 2D:
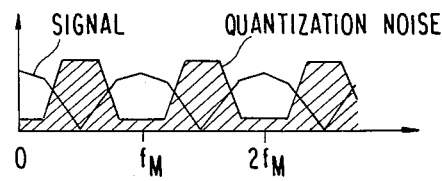

A digital FIR filter 18 is used to eliminate the quantization noise around a frequency integer multiple of the frequency $f_M$ prior to the sampling frequency reduction. The filter 18 is preferred to have the characteristic shown in FIG. 2C. When the output of the filter 18 is resampled at the frequency $f_M$ by the sampling switch 19, the spectrum repeated at the frequency $f_M$ is obtained as shown in FIG. 2D.

Figure 2E:
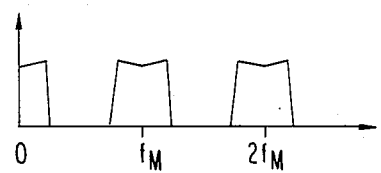
Figure 2F:
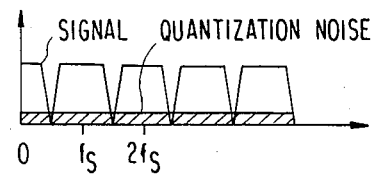

A digital IIR filter 20 is a low-pass filter with the frequency band about $f_B$ operable at the sampling frequency $f_M$ and has the frequency characteristic shown in FIG. 2E. The filter 20 is combined with the filter 18 so that the inband frequency characteristic is flat. By passing through the filter 20, the quantization noise and the frequency components of the less than $f_M - f_B$ (Hz) are suppressed sufficiently. The output of the filter 20 is then resampled by the sampling switch 21 to produce the signal with the sampling frequency $f_s$ (FIG. 2F).

In the oversampled coder of FIG. 1, the predictive integrator 16 and filter 18 perform a high-speed operation. The integrator 16 which merely accumulates the output ($\pm\Delta$) of the quantizer 15, may consist of an up-down counter or a reversible counter. On the other hand, the digital FIR filter 18 having a complicated circuit structure may be composed of an accumulator which repeatedly performs the addition $M \times (f_H/f_M)$ times to avoid such a complicated operation. This means that a digital filter has M coefficients, each of which is assumed to be "1". In the construction like this, however, the attenuation of the frequency about integral multiples of $f_M$ (Hz) is not always sufficient, and the quantization noise involved in the signal band becomes large due to the reduced sampling frequency.

The invention solves the above-mentioned problems by supplying a binary signal to the digital FIR filter, thereby making the multiplication required in the digital FIR filter unnecessary.

The principle of the invention will be described in detail. When $W(z)$ represents the z-transform of the output signal of the quantizer 15, $W(z)$ is expressed as follows:

$$W(z) = (1 - z^{-1})X(z) + (1 - z^{-1})^2 Q(z)$$

For obtaining $X(z)$ from the equation, it is necessary to multiply $X(z)$ by $1/(1 - z^{-1})$ in the process of reducing the sampling frequency. In the present invention, the operation of $1/(1 - z^{-1})$ is transformed as follows:

$$\frac{1}{1 - z^{-1}} = \frac{1 + z^{-1} + z^{-2} + z^{-3} + \ldots + z^{-(M-1)}}{1 - z^{-M}} \quad (1)$$

The numerator on the right side of the equation (1) indicates a polynomial in respect to $z^{-1}$ and a transfer function of an M-tap digital FIR filter operable at the sampling frequency $f_H$. On the other hand, the denominator on the right side represents a polynomial as to $z^{-M}$, and the operation of $1/(1 - z^{-M})$ is equal to the transfer function of the integrator having a sampling frequency of $f_H/M = f_M$. Accordingly, the operation of $1/(1 - z^{-M})$ can be executed after the sampling frequency $f_H$ has been reduced to the frequency $f_M$. Furthermore, the numerator on the right side may be incorporated with the transfer function of the filter 18 to develop a single digital FIR filter. If the number of taps of the filter 18 is $(L+1)$, the incorporation of the filter 18 with the numerator of the right term of equation (1) corresponding to the M-tap filter gives a synthetic digital FIR filter having $(M+L)$ taps. Thus, when the synthetic FIR filter decreases the sampling frequency from $f_H$ to $f_M$ and an integrator operable at the low frequency $f_M$ performs the operation of $1/(1-z^{-M})$, an A/D converted signal is obtained. The number of taps $(M+L)$ of the synthetic filter is chosen to be an integral multiple of the reduction ratio $f_H/f_M = M$. Herein the number of taps, $(M+L)$, may include a tap having a coefficient of value $=0$ and it may be an end tap. Assuming that the synthetic filter having $(M+L)$ taps has coefficients $h(0)$, $h(1)$, ..., and $h(M+L-1)$, an input signal sequence is $x(n)$, and filter output is $y(n)$, the output $y(n)$ is given by the following equation:

$$y(n) = \sum_{k=0}^{M+L-1} h(k)x(n-k) \quad (2)$$

Since the filter output is decimated by M, the output $y(n)$ is calculated at intervals of M: $y(0), y(M), y(2M), \ldots$, and $y(mM)$. Using $mM = M + L$, both $y(0)$ and $y(mM)$ are calculated by the same hardware. In other words, as understood from equation (2), the number of input samples necessary to yield $y(0)$ is $M+L$, and they are $x(-M-L+1), x(-M-L+2), \ldots, x(-1)$, and $x(0)$, respectively. Likewise, input samples necessary to yield $y(mM)$ are $x(1), x(2), \ldots$, and $x(M+L)$, the number of samples being $M+L$. The two sample sequences are successive without overlapping. Accordingly, if there is provided a device for computing the equation (2), then the computation of $y(0), y(mM), y(2mM), \ldots$ is executed by repeating the operation defined by the equation (2). Furthermore, it needs to produce a series such as $y(M), y(M+mM), y(M+2mM), \ldots$, and $y(2M), y(2+mM) \ldots$; and thus it may be adequate that m devices in total are used and their outputs are summed up. As stated above, since $x(n)$ is binary of $\pm\Delta$, under the assumption of $\Delta = 1$, the calculation according to equation (2) is achieved by a simple accumulation.

DESCRIPTION OF THE PREFERRED EMBODIMENTS

Figure 3:
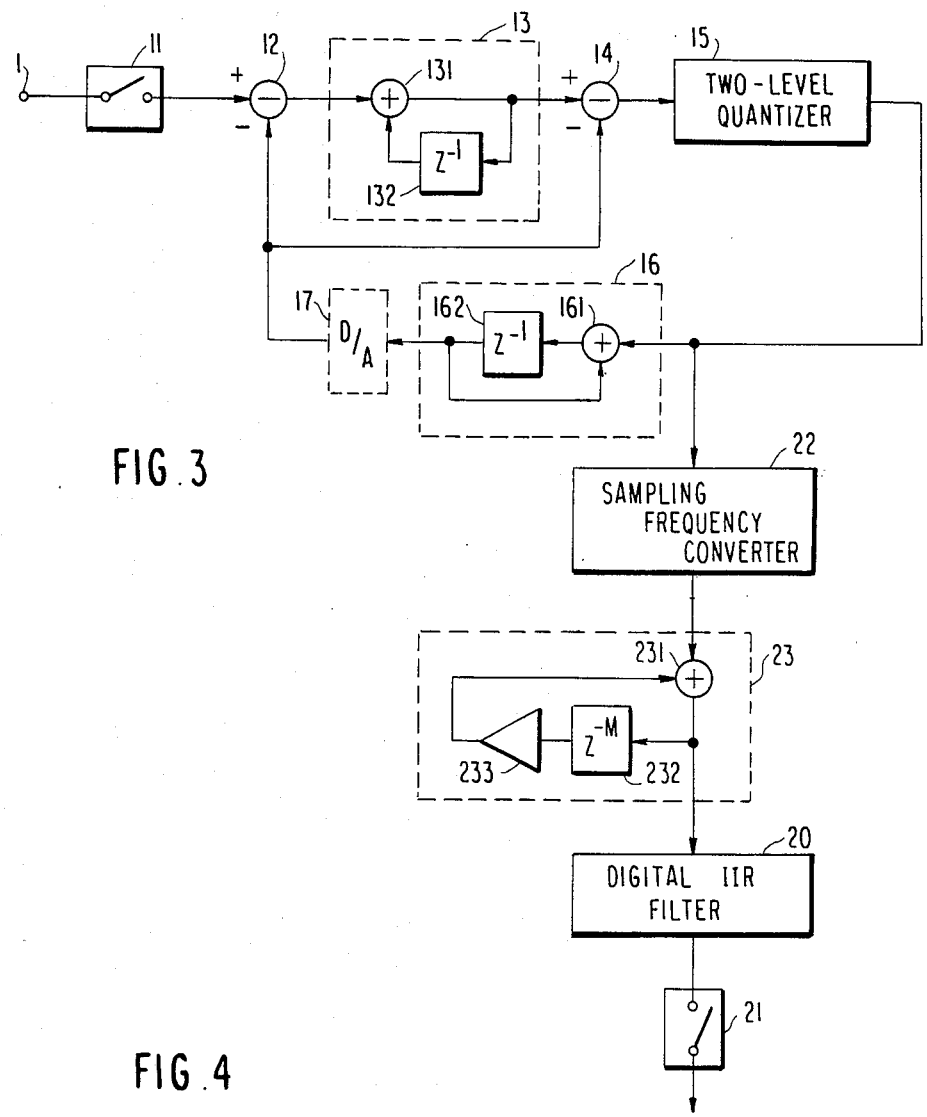
FIG. 3 is a block diagram of an embodiment of the invention.

FIG. 3 shows an embodiment of the invention in which reference numerals 1, 11, 12, 13, 14, 15, 16, 17, 20, 21, 131, 132, 161, and 162 designate components or elements corresponding to or having the same function as those designated by the same reference numerals in FIG. 1. In addition to these elements, the embodiment comprises a sampling frequencing converter 22 for converting the quantized binary signal having the sampling frequency $f_H$ and being produced by the quantizer 15, into a frequency reduced signal having a sampling frequency $f_M$, and an integrator 23 for integrating the frequency reduced signal at the frequency $f_M$.

Figure 4:
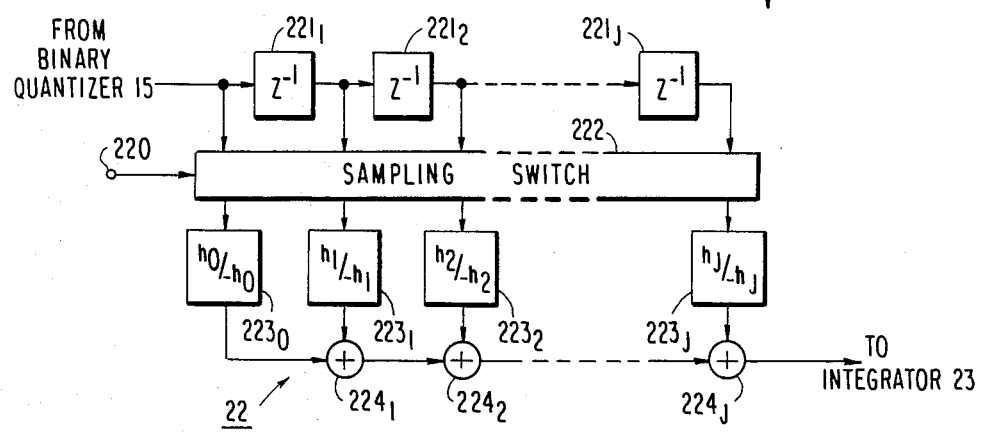
FIG. 4 is a block diagram showing a sampling frequency converter used in the embodiment.

Referring to FIG. 4 showing the converter 22, the binary quantized signal from the quantizer 15 is supplied to delay circuits $221_1, 221_2, \ldots$, and $221_J (J = M + L - 1)$. Since the quantized signal is binary $+\Delta$ or $-\Delta$, if $+\Delta$ and $-\Delta$ are allocated "1" and "0", respectively, then each of the delay circuits can be realized by a one bit flip flop. A sampling switch 222 takes out the $(J+1)$ bits from the delay circuits, in response to the sampling frequency $f_M$ supplied to a terminal 220, to produce a binary signal having the frequency $f_M$. Coefficient circuits $223_0, 223_1, \ldots$, and $223_J$ produce a coefficient $h_j$ or $-h_j (j = 0, 1, \ldots, J)$ in accordance with "0" or "1" of the output of the sampling switch 222. Adders $224_1$, $224_2, \ldots$, and $224_J$ sum outputs of all the coefficient circuits. It follows that the amount of operation necessary for the sampling frequency change is only J-times additions (subtractions) per $1/f_M$ (seconds), thereby making the multiplication of the coefficients unnecessary. Also, each delay circuit, made up of a one bit flip flop, contributes to achieving a remarkably simplified circuit structure.

Referring back to FIG. 3, the output of the converter 22 is applied to the digital integrator 23. The integrator 23 comprises an adder 231, a delay circuit 232 having delay of $1/f_M$, and a multiplier 233 and executes the operation of $1/(1-z^{-M})$ in equation 1. The multiplier 233 performs the multiplication of a given input by "$\alpha$" to bring the transfer function of the integrator 23 into $1/(1-z^{-M})$. On assuming $\alpha=1$, the inputs signal given to the digital filter 20 is equal in the structures of FIGS. 1 and 3. Generally, however, the value of $\alpha$ is preferred to be a little smaller than 1, because the value of $\alpha$ smaller than 1 reduces influence due to the initial value of the delay circuit 232 with passage of time.

Assuming that $\alpha=1-2^{-m}$(m is an integer) is established, the multiplication of $\alpha$ can be simply realized by a digit shift of a binary signal and the subtraction.

Figure 5:
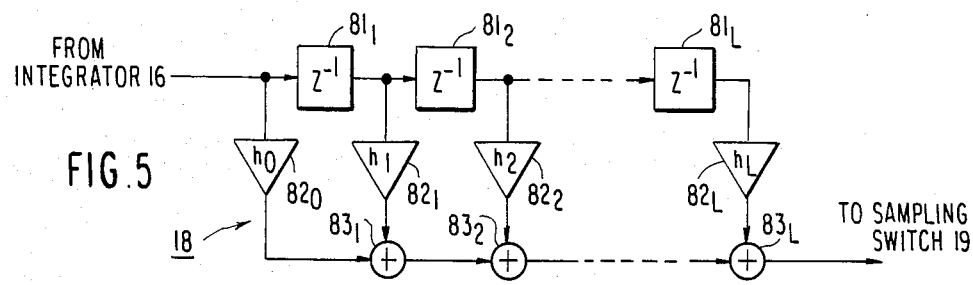
FIGS. 5 and 6 are digital filters used in the invention.

Referring to FIG. 5 showing the digital FIR filter 18, the local decoded signal given from the integrator 16 is delayed by one sample in delay circuits $81_1, 81_2, \ldots$, and $81_M$. The signals taken out of the respective delay circuits are multiplied by filter coefficients $h_0, h_1, \ldots$, and $h_L$ in multipliers $82_0, 82_1, \ldots$, and $82_L$. The outputs of the multipliers are summed by adders $83_1, 83_2, \ldots$, and $83_L$. The summed result is sent to the sampling switch 19. The filter coefficients $h_0, h_1, \ldots$, and $h_L$, are derived from an impulse response of this filter, and the Z-transforms of the impulse response and the frequency characteristic are expressed as:

$$H(z) = \sum_{i=0}^{L} h_i z_i^{-i}$$

$$H(e^{jw}) = \sum_{i=0}^{L} h_i e^{-ji}$$

Figure 6:
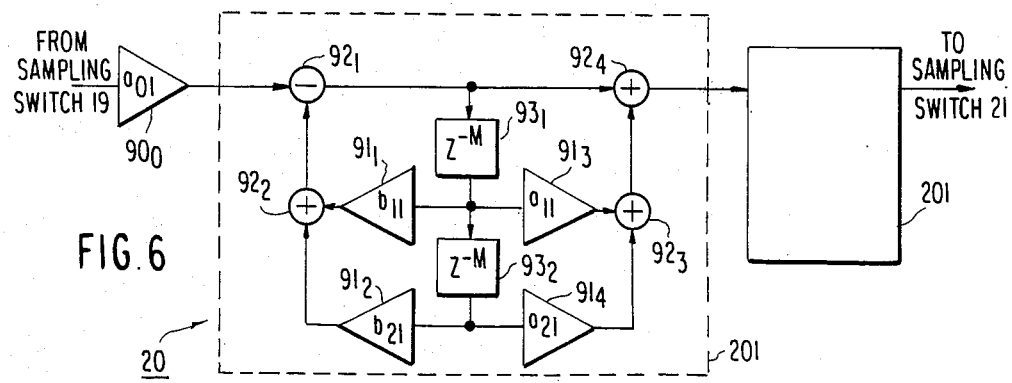

Referring to FIG. 6, the filter 20 performs the operation determined with the following system function:

$$H(z^M) = \prod_{j=1}^{J} a_0(1 + a_{1j}z^{-M} + a_{2j}z^{-2M})/(1 + b_{1j}z^{-M} + b_{2j}z^{-2M})$$

where $z^{-M}$ represents a sampling period of $1/f_M = M \cdot (1/f_H)$. Multipliers $90_0, 91_1$, and $91_2$, a subtracter $92_1$, an adder $92_2$ and delay circuits $93_1$ and $93_2$ execute the operation of $1/(1+b_{11}z^{-M}+b_{21}z^{-2M})$ in the system function $H(z^M)$. Meanwhile, the operation of $1/(1+a_{11}z^{-M}+a_{21}z^{-2M})$ is executed by multipliers $91_3, 91_4$ and adders $92_3, 92_4$.

Figure 7:
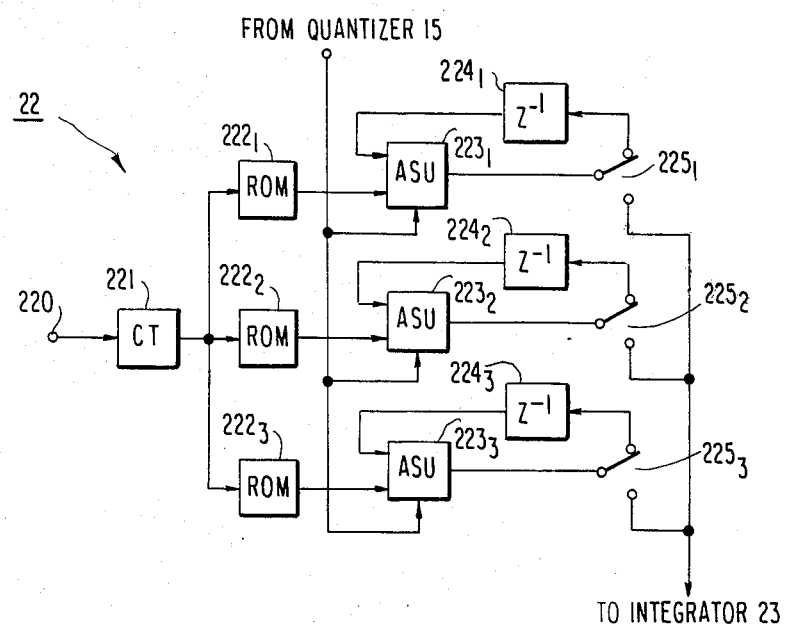
FIGS. 7 and 9 are circuit diagrams showing the detailed structure of the sampling frequency converter.

Referring to FIG. 7 showing a detail structure of the converter 22, the converter 22 comprises a counter 221, read only memories (ROM's) $222_1, 222_2$ and $222_3$, addition/subtraction units (ASU's) $223_1, 223_2$ and $223_3$, registers $225_1, 225_2$ and $225_3$ for delaying by one sampling time. The ROM $222_i$ (i=1, 2, 3) stores the filter coefficients of the (M+L) taps. The ASU $223_i$, register $224_i$ and switch $225_i$ (i=1, 2, 3) constitute an accumulator for accumulating the output of the ROM $222_i$. Herein is shown an example consisting of three accumulaters under the assumption of $(M+L)=3\times M$.

Referring to FIGS. 8A through 8L, the operation of the converter 22 shown in FIG. 7 will be described below.

Figure 8A:
Figure 8B:
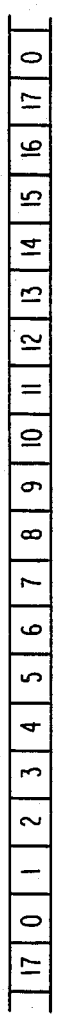
Figure 8C:
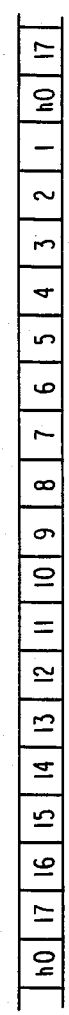
Figure 8D:
Figure 8E:
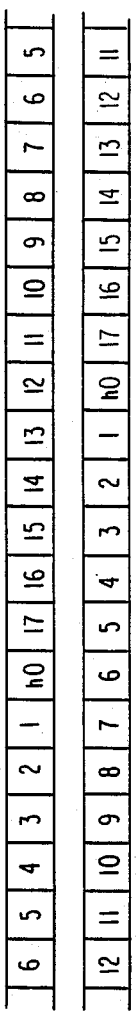

A clock pulse at $f_H$ (bits/second) (FIG. 8A) applied to a terminal 220 is subjected to (M+L) frequency division by a counter 221. FIG. 8B shows contents of the counter 221: $0, 1, 2, \ldots$, and 17 when (M+L) is 18. The ROM's $222_1, 222_2$ and $223_3$ are addressed by the outputs of the counter 221 to produce filter coefficients $h_{17}, h_{16}, h_{15}, \ldots$, and $h_0$. The addresses of the ROM's are set to correspond with deviation of M=6) to the coefficients. More specifically, when the ROM $222_1$ outputs the coefficient $h_0$, the ROM $222_2$ outputs the coefficient $h_6$. Likewise, when the ROM $222_2$ outputs the coefficient $h_0$, the ROM $222_3$ outputs coefficient $h_6$. Futherfore, when the ROM $222_3$ output the coefficient $h_0$, the ROM $222_1$ outputs the coefficient $h_6$. These relationships are shown in FIGS. 8C to 8E. In these drawings, reference numerals represent the subscripts of the coefficients $h_k$.

Figure 8F:
Figure 8G:
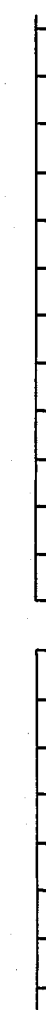
Figure 8H:
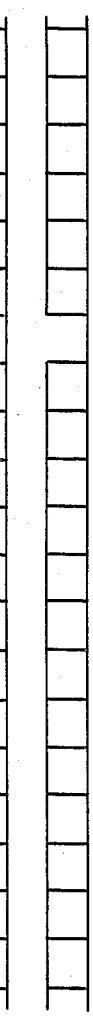
Figure 8I:
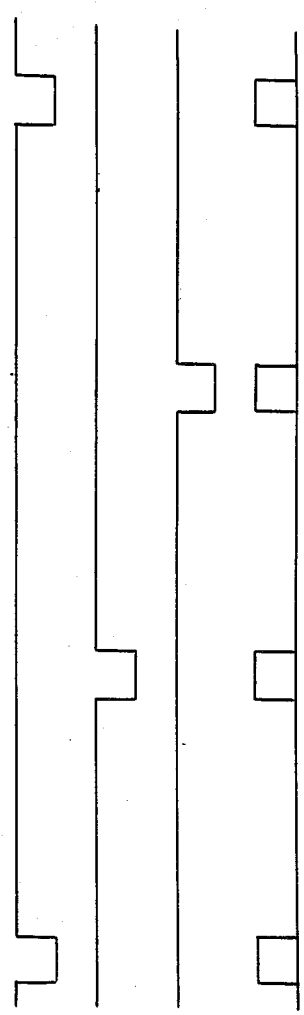
Figure 8J:
Figure 8K:

The output of the ROM $222_i$ is added to or subtracted from the output of the register $224_i$ (FIGS. 8F to 8H). As shown in FIGS. 8C to 8H, when the ROM $222_i$ produces the coefficient $h_{17}$, the output of register $224_i$ is always "0". Whether the ASU's should perform addition or subtraction depends on the quantized output $\pm\Delta$ from the quantizer 15. In the circuit shown in FIG. 7, the addition is represented by $+\Delta$, while the subtraction, by $-\Delta$. The output of the ASU $223_i$ is applied to the register $224_i$ through a switch $225_i$. FIGS. 8I through 8K exhibit the pattern of operation of the switches $225_1$ to $225_3$, in which digit "1" or "0" indicates the connection to the register $224_i$ or the integrator 23. Since the switch $225_i$ is connected to the integrator 23 upon the coefficient $h_0$ from the ROM $222_i$, "0" is supplied to the register $224_i$. Therefore, at the next time slot when the ROM $222_i$ outputs the coefficient $h_{17}$, "0" is the output from the register $224_i$. In this way, the ROM $222_i$, ASU $223_i$, register $224_i$ and switch $225_i$ perform the operation expressed by:

h(17)x(n−17)+h(16)x(n−16)+. . . +h(0)x(n)

Figure 8L:

It is noted that x(n−k) is a binary signal given from the quantizer 15. The above operation is equivalent to equation (2), and thus the combination of three circuit units as described above covers all necessary arithmetic operations. FIG. 8L shows the converted signal whose sampling frequency is decreased to one sixth.

Figure 10A:
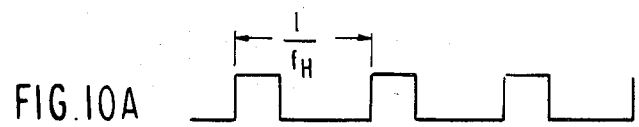
FIGS. 8A through 8L and FIGS. 10A through 10I are time charts for describing the operation of the sampling frequency converters shown in FIGS. 7 and 9.
Figure 10B:
Figure 10C:
Figure 10D:
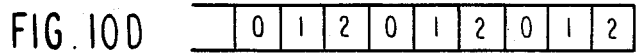
Figure 10E:
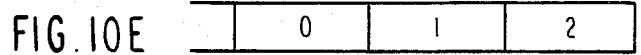
Figure 10F:
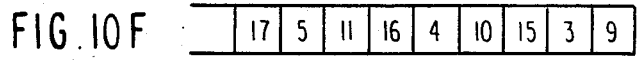
Figure 10G:
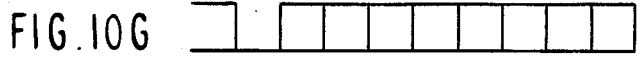
Figure 10H:
Figure 10I:
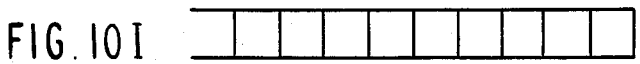
Figure 9:
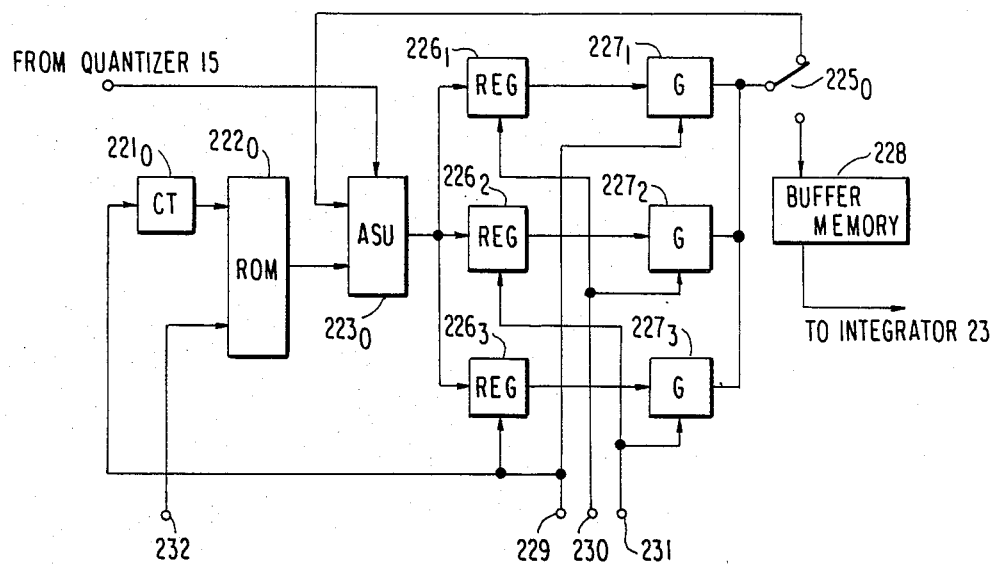

Referring to FIG. 9, a ROM $222_0$ is addressed by the content (FIG. 10) of a counter (CT) $221_0$ which is obtained by frequency-dividing the clock pulse having $f_H$ (bit/second) in (M+L) (FIG. 10A). The ROM $221_0$ receives an enabling signal given at a terminal 232, obtained by frequency dividing the clock of $3\times f_H$ (bits/second) in three. Accordingly, the ROM $222_0$ produces a filter coefficient $h_k$ changing at every $(3\times f_H)^{-1}$ seconds (FIG. 10F). This is equivalent to the time division multiplex of the outputs of the ROM's $222_1, 222_2$ and $222_3$ in FIG. 7. The required capacity of the ROM $222_0$ is $3\times(M+L)$ words, which is equal to the summation of the capacities of the ROM's $222_1, 222_2$ and $222_3$. This also means that a three ROM's $222_1, 222_2$ and $222_3$ can be substituted by a single ROM, which leads to the simplification of the circuit. The same effect can be achieved by setting the capacity of the ROM $222_0$ to (M+L) words, providing three address generator, and time-division multiplexing the three address signals. An ASU $223_0$ performs addition or subtraction between the outputs of the ROM $222_0$ and a switch $225_0$ (FIG. 10G). The quantized signal (FIG. 10H) has the sampling frequency $f_H$ and is constant during three time slots. The output of the ASU $223_0$ changes at every $(3 \times f_H)^{-1}$ seconds as shown in FIG. 10I. It follows that the ASU $223_0$ can realize the operation of the ASU's $223_1$, $223_2$ and $223_3$ shown in FIG. 7 by the time-division multiplexing technique. Registers $226_3$, $226_1$ and $226_2$ store the output of the ASU $223_0$ in response to timing pulses (1), (2) and (3) of $f_H$ (bits/second) (FIGS. 10A through 10C) applied to terminals 229 through 231. The signal stored in the register $223_i$ is supplied to a switch $225_0$ through a gate $227_i$. The gate $227_i$ passes the output of the register $223_i$ in response to "1" of the timing pulse (1), (2) or (3) to time-division multiplex the output of the register $226_i$. The switch $225_0$ connects the gate $227_i$ to a buffer memory 228 to give "0" to the ASU$223_0$ at the time when the ROM $222_0$ outputs the coefficient $h_{17}$. The buffer memory 28 absorbs time fluctuation of the gate's output changing within $(3 \times f_H)^{-1}$ seconds. The sampling frequency converter 22 shown in FIG. 9 is the same in principle and function as that shown in FIG. 7 though different in circuitry as a means for realization between them.

The invention enables the reduction of a sampling frequency without needing complicated multiplication. Though the two-step reduction of the sampling frequency has been described with reference to FIG. 3, alternatively usable is the method for directly reducing the sampling frequency from $f_H$ to $f_s$. This method requires an FIR filter having a frequency characteristic in which attenuation is large in the out-of-band and gain deviation is small in the inband. Such an FIR filter has remarkably large number of taps and the coefficients complicated. In this case, however, according to the invention, it can do with only performing addition (subtraction) the number of times corresponding to the number of taps during the period of $1/f_s$ without needing multiplication.

The invention contributes to minimizing the total device and lowering power consumption and the manufacturing cost of an A/D converter.

The invention also provides the advantage that the integrator 16 (FIG. 3) may be an analog integrator, with the consequent omission of the D/A converter 17.

What is claimed is:

1. An oversampled analog-to-digital conversion method comprising the steps of:
   (A) oversampling an input analog signal at a first frequency higher than the Nyquist frequency to produce a sampled signal;
   (B) subtracting a local decoded signal from the sampled signal;
   (C) quantizing the subtracted signal into a quantized binary signal;
   (D) generating said local decoded signal by integration of the quantized binary signal;
   (E) converting the quantized binary signal having the first frequency into a frequency-reduced signal having a second frequency, said converting step further including:
      (a) generating a plurality of coefficient groups each of which has a plurality of coefficients,
      (b) performing in response to said quantized binary signal an addition or subtracting of each coefficient belonging to said each group for every group to produce a processed result for every group,
      (c) accumulating the processed result for every group to produce an accumulater result for every group, and
      (d) producing said frequency-reduced signal based on said accumulated result for every group; and
   (F) integrating the frequency-reduced signal at the second frequency to provide a converted digital signal.

2. An oversampled analog-to-digital converter comprising:
   (A) means for sampling an input analog signal at a first frequency higher than the Nyquist frequency to produce a sampled signal;
   (B) subtracting means for subtracting a local decoded signal from the sampled signal;
   (C) quantizing means for quantizing the output of the subtracting means to produce a quantized binary signal having a first frequency;
   (D) means for integrating the quantized binary signal to generate the local decoded signal;
   (E) converting means for converting the quantized binary signal having the first frequency-reduced signal having a second frequency, said converting means further including:
      (a) coefficient generating means for generating a plurality of coefficient groups each of which has a plurality of coefficients,
      (b) processing means responsive to said quantized binary signal for performing an addition or subtraction of each coefficient belonging to said each group of every group to produce a processed result for every group,
      (c) accumulating means for accumulating the processed result for every group to produce an accumulated result for every group, and
      (d) means for producing said frequency-reduced signal based on said accumulated result for every group; and
   (F) integrating means for integrating the frequency-reduced signal at the second frequency to provide a converted digital signal.

3. The invention as claimed in claim 2 wherein the means for integrating the quantized binary signal includes an analog integrator circuit.

4. An oversampled analog-to-digital converter as claimed in claim 2 wherein said converting means includes a plurality of accumulators for performing addition or subtraction in accordance with said quantized binary signal, read only memory means for supplying contents stored therein to said accumulators, and switching means for extracting accumulated outputs from said accumulators and clearing said accumulators.

5. The invention as claimed in claim 2 wherein the means for integrating the frequency reduced signal comprises an adder connected to receive the output from said converter means, a delay circuit connected to receive said adder output and having a delay of $1/f_M$ and a multiplier means connected to the output of said delay circuit and having a transfer function of $1/(1-\alpha Z^{-M})$ where $\alpha \leq 1$, $f_M$ is the frequency output of said converter means, Z is the transform of the output from the quantizer means and M is equal to $f_H/f_M$ where $f_H$ is the frequency input to said converter means.

* * * * *

UNITED STATES PATENT AND TRADEMARK OFFICE
CERTIFICATE OF CORRECTION

PATENT NO. : 4,684,925
DATED : August 4, 1987
INVENTOR(S) : Maruta

It is certified that error appears in the above-identified patent and that said Letters Patent is hereby corrected as shown below:

COLUMN 2, LINE 22   Delete "structure" and insert --structures--;

COLUMN 3, LINE 26   Delete "MX($f_H/f_M$)" insert --M = ($f_H/f_M$)--

COLUMN 4, LINE 35   Delete "y(2 + mM)" insert --y(2M +mM)--

COLUMN 5, LINE 16   Delete "$1/(1-z^{-M})$" insert --$1/(1 -\alpha z^{-M})$--

Signed and Sealed this

Sixteenth Day of August, 1988

Attest:

DONALD J. QUIGG

Attesting Officer     Commissioner of Patents and Trademarks